United States Patent
Kang et al.

(10) Patent No.: US 9,006,067 B2
(45) Date of Patent: Apr. 14, 2015

(54) SEMICONDUCTOR DEVICE AND METHOD OF FABRICATIONG THE SAME

(71) Applicant: Samsung Electronics Co., Ltd., Suwon-si, Gyeonggi-do (KR)

(72) Inventors: Bo Kyeong Kang, Seoul (KR); Jaeseok Kim, Seoul (KR); Boun Yoon, Seoul (KR); Hoyoung Kim, Seongnam-si (KR); Ilyoung Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/146,185

(22) Filed: Jan. 2, 2014

(65) Prior Publication Data
US 2014/0227848 A1 Aug. 14, 2014

(30) Foreign Application Priority Data
Feb. 14, 2013 (KR) ........................ 10-2013-0015890

(51) Int. Cl.
*H01L 21/8234* (2006.01)

(52) U.S. Cl.
CPC *H01L 21/823431* (2013.01); *H01L 21/823456* (2013.01); *H01L 21/823481* (2013.01)

(58) Field of Classification Search
USPC .................. 257/329, 330; 438/206, 270, 283
See application file for complete search history.

(56) References Cited

U.S. PATENT DOCUMENTS

| | | | |
|---|---|---|---|
| 7,015,106 B2 | 3/2006 | Yoon et al. | |
| 7,285,466 B2 | 10/2007 | Kim et al. | |
| 7,394,116 B2 | 7/2008 | Kim et al. | |
| 7,655,988 B2 | 2/2010 | Jang et al. | |
| 7,691,689 B2 | 4/2010 | Jang et al. | |
| 7,718,493 B2 | 5/2010 | Lee | |
| 7,745,319 B2 | 6/2010 | Tang et al. | |
| 7,824,983 B2 | 11/2010 | Juengling | |
| 7,879,659 B2 | 2/2011 | Wilson et al. | |
| 7,955,913 B2 | 6/2011 | Kim | |
| 8,202,768 B2 | 6/2012 | Lander | |
| 2005/0029583 A1* | 2/2005 | Popp et al. | 257/329 |
| 2005/0056888 A1* | 3/2005 | Youn et al. | 257/331 |
| 2011/0248348 A1 | 10/2011 | Gan et al. | |

FOREIGN PATENT DOCUMENTS

KR 10-2006-0112853 A 11/2006

* cited by examiner

*Primary Examiner* — Kimberly Rizkallah
*Assistant Examiner* — Brian Turner
(74) *Attorney, Agent, or Firm* — Lee & Morse, P.C.

(57) ABSTRACT

A method of fabricating a semiconductor device includes forming first gate patterns on a semiconductor substrate using an etch mask pattern, forming a trench in the semiconductor substrate between the first gate patterns, forming an insulating layer in the trench, such that the insulating layer fills the trench and is disposed on the etch mask pattern, planarizing the insulating layer until a top surface of the etch mask pattern is exposed, etching a portion of the planarized insulating layer to form a device isolation layer in the trench, forming a second gate layer covering the etch mask pattern and disposed on the device isolation pattern, and planarizing the second gate layer until the top surface of the etch mask pattern is exposed, such that a second gate pattern is formed.

15 Claims, 12 Drawing Sheets

SEMICONDUCTOR DEVICE AND METHOD OF FABRICATIONG THE SAME

CROSS-REFERENCE TO RELATED APPLICATION

Korean Patent Application No. 10-2013-0015890, filed on Feb. 14, 2013, in the Korean Intellectual Property Office, and entitled: "Semiconductor Device and Method of Fabricating the Same," is incorporated by reference herein in its entirety.

BACKGROUND

1. Field

Embodiments relate to semiconductor devices and methods of fabricating the same and, more particularly, to semiconductor devices including fin field effect transistors (fin-FETs) and methods of fabricating the same.

2. Description of the Related Art

A field effect transistor (FET) may include an active region, a gate electrode crossing over the active region, and source and drain regions formed in the active region at both sides of the gate electrode. The active region under the gate electrode may be used as a channel region of the FET.

Widths of the gate electrode and the active region are being reduced with high integration of the semiconductor device. Since the width of the gate electrode is reduced, a channel length (i.e., a distance between the source region and the drain region) of the channel region is also reduced in the FET. Thus, short channel effects (e.g., a drain induced barrier lowering (DIBL) phenomenon and/or a punch-through phenomenon) may be exhibited in the FET. Additionally, since the width of the active region is reduced, a channel width of the channel region is also reduced. Thus, a narrow width effect (e.g., reduction of a drain current) may be exhibited in the FET.

Recently, fin field effect transistors (fin-FETs) having vertical channel regions have been suggested. In a fin-FET, a gate electrode controls three surfaces of a channel region. Thus, the short channel effects may be effectively improved in the fin-FET. Additionally, since the fin-FET has a vertical channel region, a channel width of the fin-FET may be increased in a limited area. Thus, the narrow width effect may be improved in the fin-FET.

SUMMARY

Embodiments provide simplified methods of fabricating a semiconductor device.

Embodiments also provide semiconductor devices with structures requiring simplified fabrication processes.

In one aspect, a method of fabricating a semiconductor device may include forming first gate patterns on a semiconductor substrate using an etch mask pattern, forming a trench in the semiconductor substrate between the first gate patterns, forming an insulating layer in the trench, such that the insulating layer fills the trench and is disposed on the etch mask pattern, planarizing the insulating layer until a top surface of the etch mask, pattern is exposed, etching a portion of the planarized insulating layer to form a device isolation layer in the trench, forming a second gate layer covering the etch mask pattern and disposed on the device isolation pattern, and planarizing the second gate layer until the top surface of the etch mask pattern is exposed, such that a second gate pattern is formed.

In some embodiments, before forming the first gate patterns, the method may further include forming fins vertically protruding from the semiconductor substrate, and performing a thermal oxidation process on the semiconductor substrate to form a gate insulating layer conformally covering surfaces of the fins.

In some embodiments, the fins between the first gate patterns may be removed when the first gate patterns are formed.

In some embodiments, forming the device isolation layer may include etching the insulating layer until sidewalls of the first gate patterns are completely exposed.

In some embodiments, forming the device isolation layer may include etching the insulating layer until portions of sidewalls of the first gate patterns are exposed.

In some embodiments, the etch mask pattern may include a material having an etch selectivity with respect to the insulating layer and the second gate pattern.

In some embodiments, the etch mask pattern may include silicon nitride (SiN) or silicon oxide ($SiO_2$).

In some embodiments, after the formation of the second gate pattern, the method may further include recessing a top surface of the second gate pattern exposed by the etch mask pattern, removing the etch mask pattern to expose top surfaces of the first gate patterns, and polishing the top surfaces of the first gate patterns and the top surface of the second gate pattern.

In another aspect, a semiconductor device may include a semiconductor substrate including a device isolation layer defining an active region, a plurality fins vertically protruding from the semiconductor substrate, the fins extending in one direction in a plan view, a gate electrode crossing over the fins, the gate electrode covering portions of top surfaces of the device isolation layer and the fins, and a source region and a drain region formed in the active region adjacent to both sides of the gate electrode, respectively. A top surface of the device isolation layer may be disposed at a level between a level of a top surface of the semiconductor substrate and a level of a top surface of the fins. The gate electrode may include a first gate pattern and a second gate pattern. The first gate pattern may be disposed on the active region and the second gate pattern may be disposed on the device isolation layer.

In some embodiments, the top surface of the device isolation layer and the top surface of the semiconductor substrate may be on the same plane.

In some embodiments, the semiconductor device may further include a gate insulating layer disposed between the first gate pattern and the semiconductor substrate.

In some embodiments, the second gate pattern may have a sidewall making an angle equal to or greater than about 90 degrees and less than about 180 degrees with the top surface of the device isolation layer.

In yet another aspect, a method of fabricating a semiconductor device may include forming first gate patterns on a semiconductor substrate using an etch mask pattern, forming a trench in the semiconductor substrate between the first gate patterns, forming an insulating layer in the trench, such that the insulating layer fills the trench and cover a top of the etch mask pattern, planarizing the insulating layer to expose the top surface of the etch mask pattern, etching a portion of the planarized insulating layer to form a device isolation layer in the trench, forming a second gate layer to fill the trench, such that second gate layer is on the device isolation pattern and on the top of the etch mask pattern, planarizing the second gate layer to expose the top surface of the etch mask pattern, such that a second gate pattern is formed, removing a portion of the second gate pattern, removing etch mask pattern, such that a top surface of the first gate pattern is exposed, and polishing simultaneously the first and second gate patterns to form a uniform flat surface.

Removing the portion of the second gate pattern may include removing a portion having a thickness that substantially equals a thickness of the etch mask pattern.

Polishing the first and second gate patterns to form the uniform flat surface may include defining the first and second gate patterns as a single conductive electrode crossing a plurality of fins.

After forming the first gate patterns, the etch mask pattern may cover a top surface of only the first gate patterns among the first and second gate patterns.

Forming the trench may include separating adjacent first gate patterns, such that every trench is between two adjacent first gate patterns.

Forming the second gate layer in the trench may include filling the trench completely with the second gate layer, such that the second gate layer directly contacts and extends along sidewalls of two adjacent first gate patterns.

Planarizing the second gate layer and removing a portion of the second gate pattern may be performed while the etch mask pattern completely covers a top surface of the first gate pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Embodiments will now be described more fully hereinafter with reference to the accompanying drawings, in which exemplary embodiments are shown. The advantages and features of the embodiments will be apparent from the following description and the accompanying drawings. It should be noted, however, that embodiments are not limited to the following description and drawings, and may be implemented in various forms. Accordingly, the exemplary embodiments are provided so that this disclosure will be thorough and complete, and will fully convey exemplary implementations to those skilled in the art.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the actual shape of a region. Further, in the drawings, embodiments are not limited to the specific examples provided and may be exaggerated for clarity.

Figure 1:
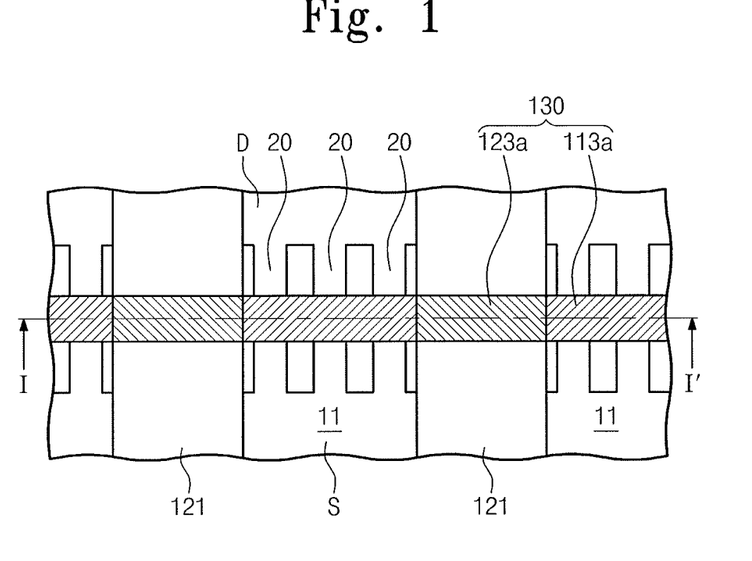
FIG. 1 illustrates a plan view of a semiconductor device according to some embodiments.
Figure 2:
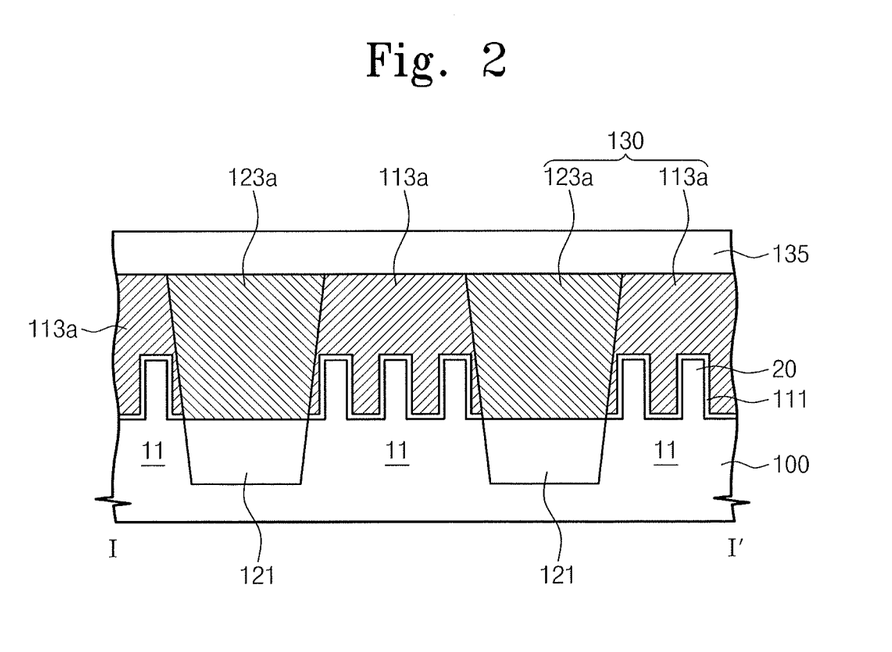
FIG. 2 illustrates a cross-sectional view along line I-I' in FIG. 1 of embodiments.
Figure 3:
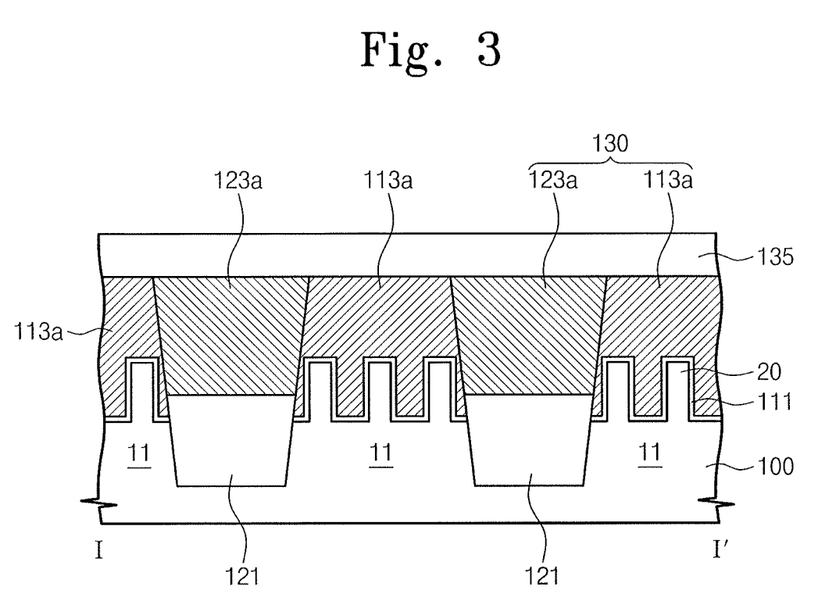
FIG. 3 illustrates a cross-sectional view along line I-I' in FIG. 1 of other embodiments.

FIG. 1 illustrates a plan view of a semiconductor device according to some embodiments. FIG. 2 illustrates a cross-sectional view taken along line I-I' of FIG. 1 to illustrate a semiconductor device according to some embodiments. FIG. 3 illustrates a cross-sectional view taken along line I-I' of FIG. 1 to illustrate a semiconductor device according to other embodiments.

Referring to FIGS. 1 and 2, a device isolation layer 121 defining active regions 11 may be disposed on/in a semiconductor substrate 100. The semiconductor substrate 100 may be, e.g., a bulk silicon substrate or a silicon-on-insulator (SOI) substrate. The device isolation layer 121 may include, e.g., silicon oxide. In some embodiments, a top surface of the device isolation layer 121 and a top surface of the semiconductor substrate 100 may be on the same plane, e.g., coplanar. That is, the top surface of the device isolation layer 121 may be disposed at substantially the same level as the top surface of the semiconductor substrate 100, as illustrated in FIG. 2. In other embodiments, a top surface of the device isolation layer 121 may be higher than the top surface of the semiconductor substrate 100, as illustrated in FIG. 3.

Fins 20 may be disposed on the active regions 11 of the semiconductor substrate 100. The fins 20 may vertically protrude from the top surface of the semiconductor substrate 100. Top surfaces of the fins 20 may be higher than the top surface of the device isolation layer 121. The fins 20 may extend in parallel in a first direction on the semiconductor substrate 100 in a plan view. The fins 20 may be arranged, e.g., spaced apart from each other, along a second direction different from the first direction in a plan view. A number of the fins 20 may be varied depending on characteristics of a field effect transistor.

A gate electrode 130 may be disposed on the semiconductor substrate 100. The gate electrode 130 may extend in the second direction to cross over the fins 20. The gate electrode 130 may be formed on portions of the fins 20 and portions of the device isolation layer 121. The gate electrode 130 may completely fill a space between the fins 20 thereunder. The portions of the fins 20 surrounded by the gate electrode 130 may be a channel region of the transistor.

The gate electrode 130 may include at least one first gate pattern 113a and at least one second gate pattern 123a. The first gate pattern 113a may be formed on the active region 11 and may, e.g., partially, cover the fins 20. The second gate pattern 123a may be formed on the device isolation layer 121. As illustrated in FIG. 1, the second gate pattern 123a may be disposed between two adjacent first gate patterns 113a. The second gate pattern 123a may have a sidewall making an angle of about 90 degrees to about 180 degrees with the top surface of the device isolation layer 121, as illustrated in FIG. 2.

A source region S and a drain region D may be formed in the active region 11 at both sides of the gate electrode 130, respectively. The fins 20 between the source region S and the drain region D may be the channel region of the transistor.

A gate insulating layer 111 may be disposed between the first gate pattern 113a and the fins 20. The gate insulating layer 111 may conformally cover surfaces of the fins 20. The gate insulating layer 111 may be a thermal silicon oxide layer.

A hard mask 135 may be disposed on the gate electrode 130. The hard mask 135 may include an insulating material, e.g., silicon nitride.

FIGS. 4 to 22 illustrate cross-sectional views of stages in a method of fabricating a semiconductor device according to some embodiments.

Figure 4:
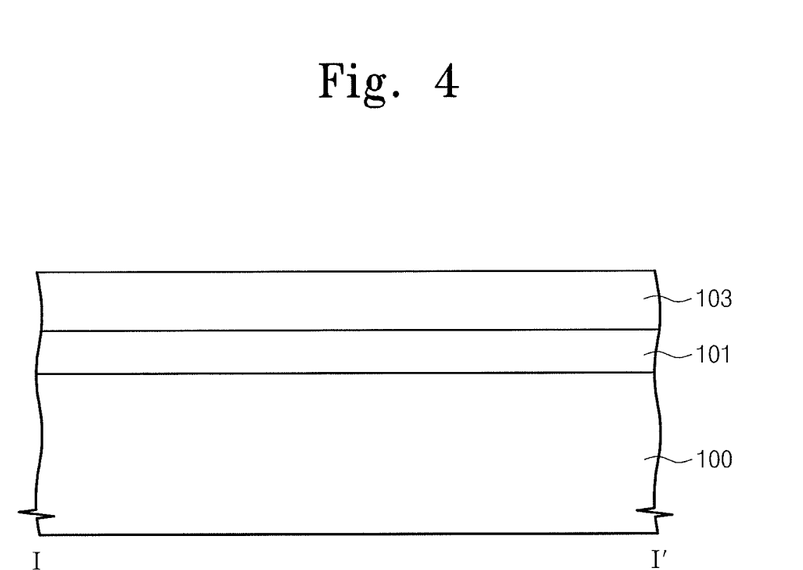
FIGS. 4 to 22 illustrate cross-sectional views of stages in a method of fabricating a semiconductor device according to some embodiments.

Referring to FIG. 4, a first hard mask layer 101 and a buffer layer 103 may be sequentially formed on the semiconductor substrate 100. The semiconductor substrate 100 may be, e.g., a bulk silicon substrate or a SOI substrate. The first hard mask layer 101 may be formed of a material having an etch selectivity with respect to the semiconductor substrate 100. For example, the first hard mask layer 101 may include a silicon nitride layer. The buffer layer 103 may be formed in order to define shapes of fins. The buffer layer 103 may be formed of a material having an etch selectivity with respect to the first hard mask layer 101. For example, the buffer layer 103 may be formed of silicon oxide. A natural oxide layer (not shown) may be formed between the semiconductor substrate 100 and the first hard mask layer 101.

Figure 5:
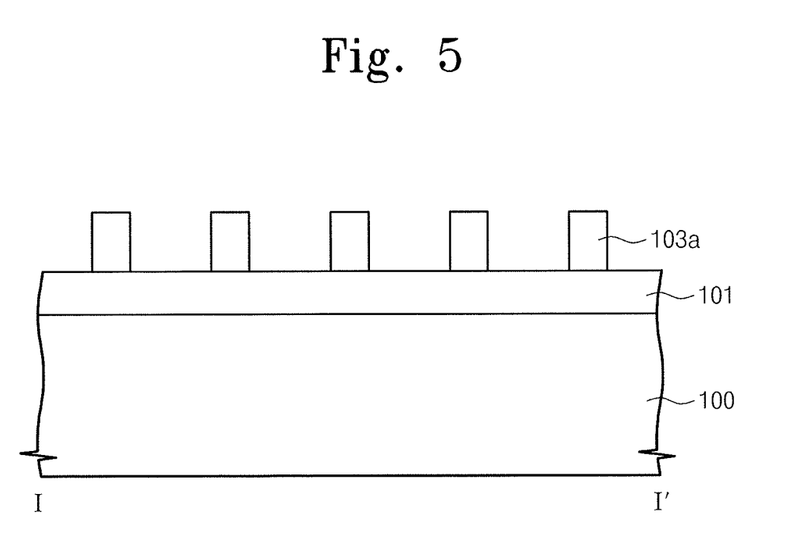

Referring to FIG. 5, the buffer layer 103 may be patterned to form buffer patterns 103a. A width of each buffer pattern 103a may correspond to a distance between adjacent fins formed in a subsequent process. Since the buffer patterns 103a are formed, portions of the first hard mask layer 101 may be exposed.

Figure 6:
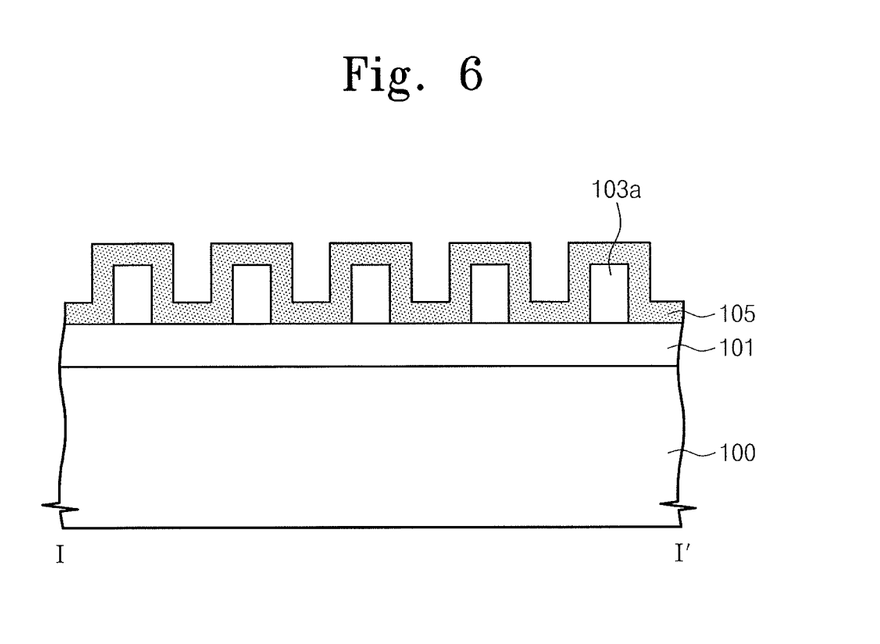

Referring to FIG. 6, a second hard mask layer 105 may be conformally formed on the buffer patterns 103a and the first hard mask layer 101. A thickness of the second hard mask layer 105 may be determined depending on widths of the fins. In some embodiments, the second hard mask layer 105 may have a thickness in a range of about 300 Å to about 500 Å. The second hard mask layer 105 may be formed of a material having an etch selectivity with respect to the first hard mask layer 101. For example, the second hard mask layer 105 may be a poly-silicon layer.

Figure 7:
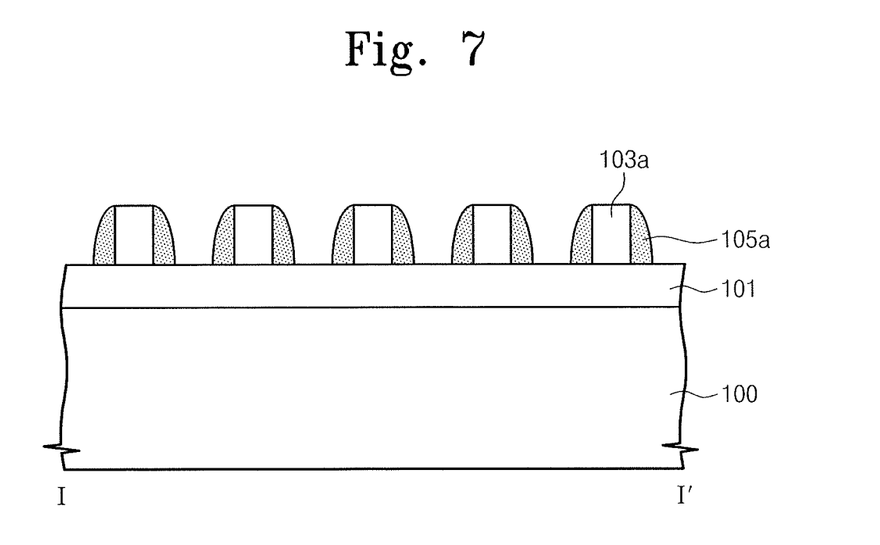

Referring to FIG. 7, portions of the second hard mask layer 105 may be etched to form second hard mask patterns 105a on sidewalls of the buffer patterns 103a. In more detail, an etch-back process may be performed on the second hard mask layer 105 to remove the second hard mask layer 105 formed on a top surface of the first hard mask layer 101 and top surfaces of the buffer patterns 103a.

Figure 8:
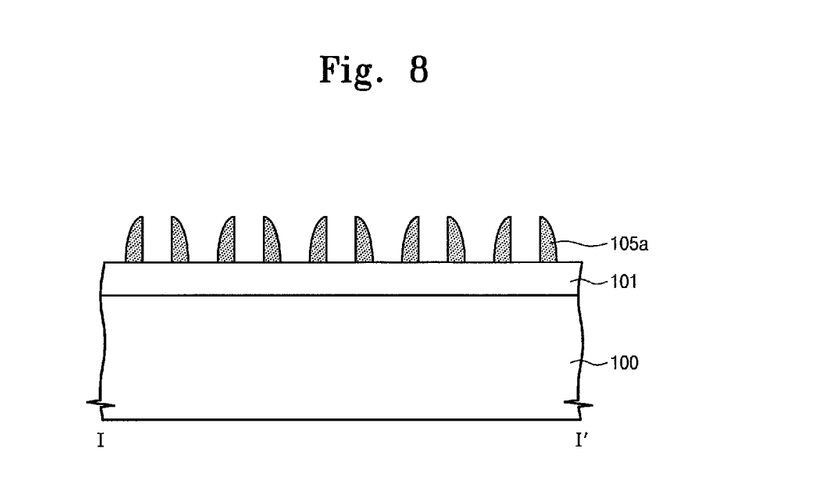

Referring to FIG. 8, the buffer patterns 103a may be removed. The buffer patterns 103a may be removed by a wet etching process. For example, if the buffer patterns 103a are formed of silicon oxide, the buffer patterns 103a may be removed using a buffered oxide etchant (BOE) solution. After the buffer patterns 103a are removed, the second hard mask patterns 105a remain on the first hard mask layer 101.

Figure 9:
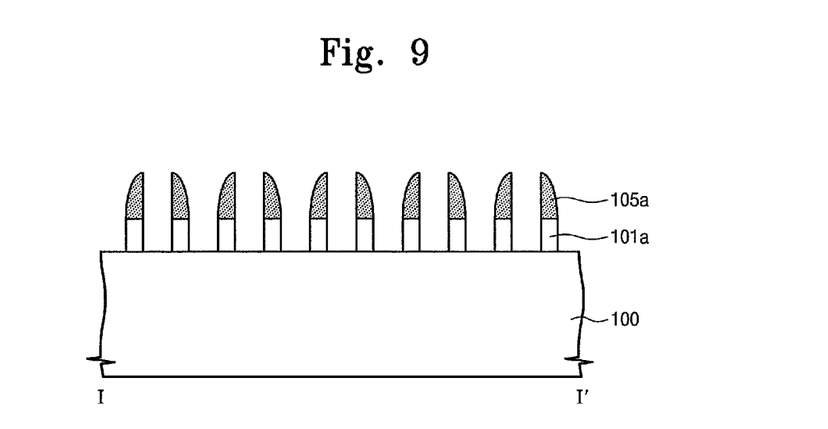

Referring to FIG. 9, the first hard mask layer 101 exposed by the second hard mask patterns 105a may be etched to form first hard mask patterns 101a. The first hard mask layer 101 may be etched by an anisotropic wet etching process or an anisotropic dry etching process. Thus, the first hard mask patterns 101a may have sidewalls substantially perpendicular to the top surface of the semiconductor substrate 100. Additionally, widths of the first hard mask patterns 101a may be substantially equal to widths of bottom surfaces of the second hard mask patterns 105a.

Figure 10:
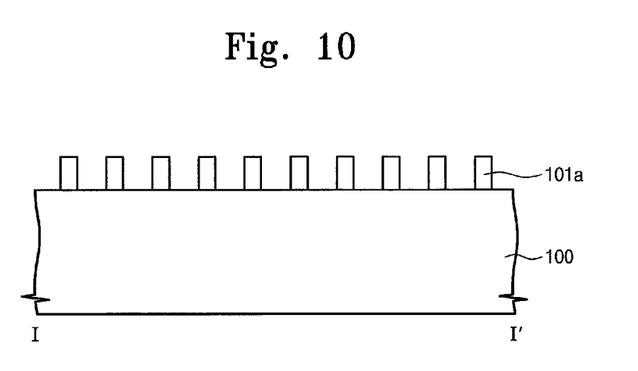

Referring to FIG. 10, the second hard mask patterns 105a may be removed. The second hard mask patterns 105a may be removed by a wet etching process, a dry etching process, or a chemical isotropic etching process. After the second hard mask patterns 105a are removed, the first hard mask patterns 101a may remain on the semiconductor substrate 100.

Figure 11:
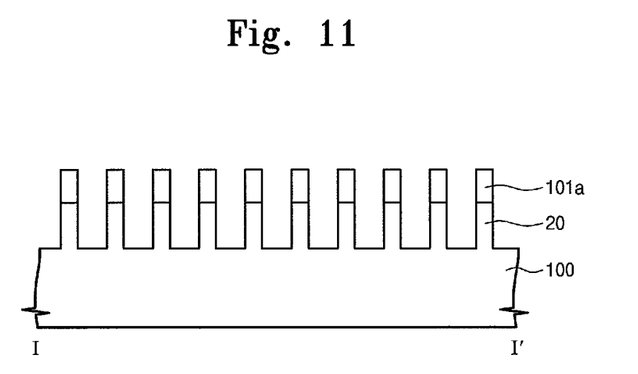

Referring to FIG. 11, the semiconductor substrate 100 exposed by the first hard mask patterns 101a may be etched using the first hard mask patterns 101a as etch masks. An anisotropic dry etching process or an anisotropic wet etching process may be performed on the semiconductor substrate 100. Thus, the top surface of the semiconductor substrate 100 exposed by the first hard mask patterns 101a may be recessed to form the fins 20 vertically protruding from the semiconductor substrate 100. A height, e.g., of each, of the fins 20 may be varied depending on an etching amount of the semiconductor substrate 100.

Figure 12:
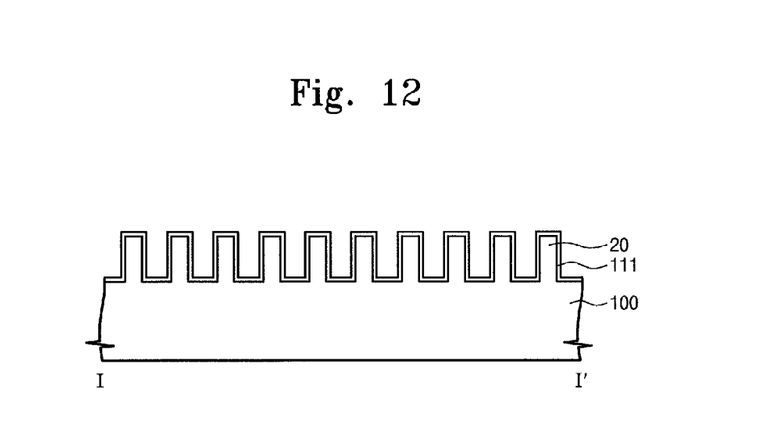

Referring to FIG. 12, the first hard mask patterns 101a may be removed to expose top surfaces of the fins 20. If the first hard mask patterns 101a are formed of silicon nitride, the first hard mask patterns 101a may be removed using a phosphoric acid ($H_3PO_4$) solution. A gate insulating layer 111 may be formed on a surface of the semiconductor substrate 100 including the fins 20. The gate insulating layer 111 may be formed by performing a thermal oxidation process on the semiconductor substrate 100. The thermal oxidation process may be performed under an atmosphere including an oxygen gas.

Figure 13:
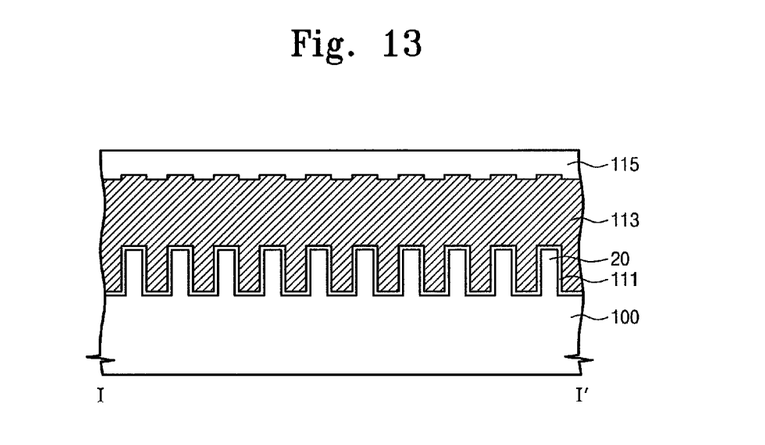

Referring to FIG. 13, a first gate layer 113 may be formed on the semiconductor substrate 100. The first gate layer 113 may completely fill spaces between the fins 20 and may completely cover the fins 20. The first gate layer 113 may be formed using at least one of a chemical vapor deposition (CVD) method, a physical vapor deposition (PVD) method, and an atomic layer deposition (ALD) method. The first gate layer 113 may have an uneven top surface due to shapes, i.e., protruding structures, of the fins 20. This is because the first gate layer 113 is deposited along a profile including the top surfaces of the fins 20 and surfaces of the semiconductor substrate 100 between the fins 20. The surfaces of the semiconductor substrate 100 between the fins 20 are lower than the top surfaces of the fins 20. As a result, a portion of a top surface of the first gate layer 113 on the top surfaces of the fins 20 may be higher than a portion of the top surface of the first gate layer 113 on the surface of the semiconductor substrate 100 between adjacent fins 20. The first gate layer 113 may include, e.g., poly-silicon, a metal material, and/or a metal silicide material.

An etch mask layer 115 may be formed on the first gate layer 113. The etch mask layer 115 may include a material having an etch selectivity with respect to an insulating layer 119 and a second gate layer 123 formed in subsequent processes. In some embodiments, a ratio of an etch rate of the etch mask layer 115 to an etch rate of the insulating layer 119 may be about 1:10. Additionally, a ratio of an etch rate of the etch mask layer 115 to an etch rate of the second gate layer 123 may be about 1:10. For example, the etch mask layer 115 may include silicon nitride or silicon oxide (e.g., low deposition rate tetra ethyl ortho silicon (LDTEOS)). The etch mask layer 115 may be deposited to have a thickness of about 100 Å or more.

Figure 14:
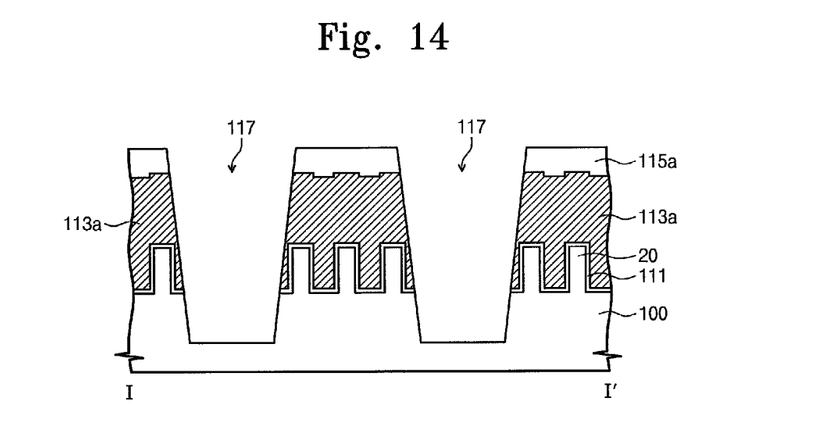

Referring to FIG. 14, the etch mask layer 115 may be patterned to form at least one etch mask pattern 115a. The first gate layer 113 and the semiconductor substrate 100 may be successively etched using the etch mask pattern 115a. In more detail, portions of the first gate layer 113 exposed by the etch mask pattern 115a may be removed, and then the top surface of the semiconductor substrate 100 may be recessed to form a device isolation trench 117. A portion of the first gate layer 113 may be removed to form at least one first gate pattern 113a on the semiconductor substrate 100. The etching process of the first gate layer 113 and the semiconductor substrate 100 may be an anisotropic wet etching process and/or an anisotropic dry etching process. When the device isolation trench 117 is formed, the fins 20 between the first gate patterns 113a may be removed.

Figure 15:
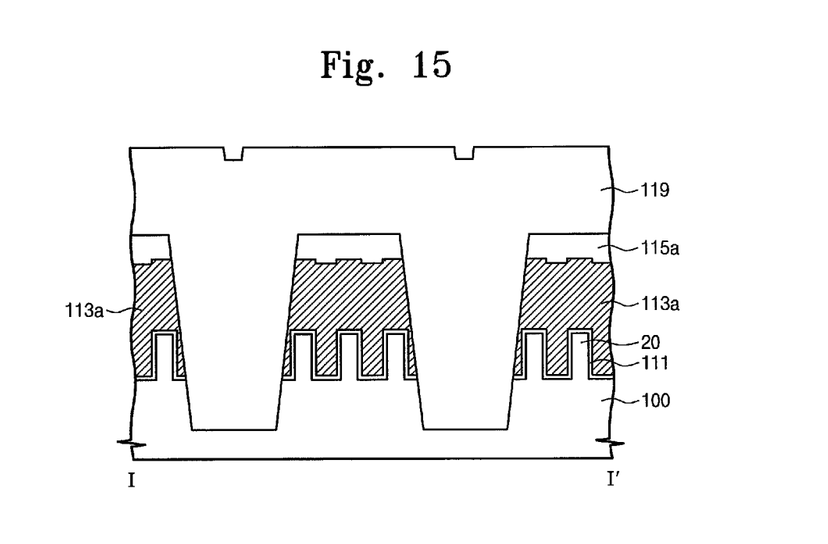

Referring to FIG. 15, the insulating layer 119 may be deposited on the semiconductor substrate 100 to fill the device isolation trench 117. The insulating layer 119 may cover the etch mask pattern 115a. The insulating layer 119 may be deposited using a CVD method, a PVD method, and/or an ALD method. A top surface of the insulating layer 119 may have a height difference due to a difference between a height of a bottom surface of the device isolation trench 117 and a height of a top surface of the etch mask pattern 115a. Thus, a top surface of the insulating layer 119 deposited on the bottom surface of the device isolation trench 117 may be lower than a top surface of the insulating layer 119 deposited on the etch mask pattern 115a. The insulating layer 119 may include a silicon oxide layer.

Figure 16:
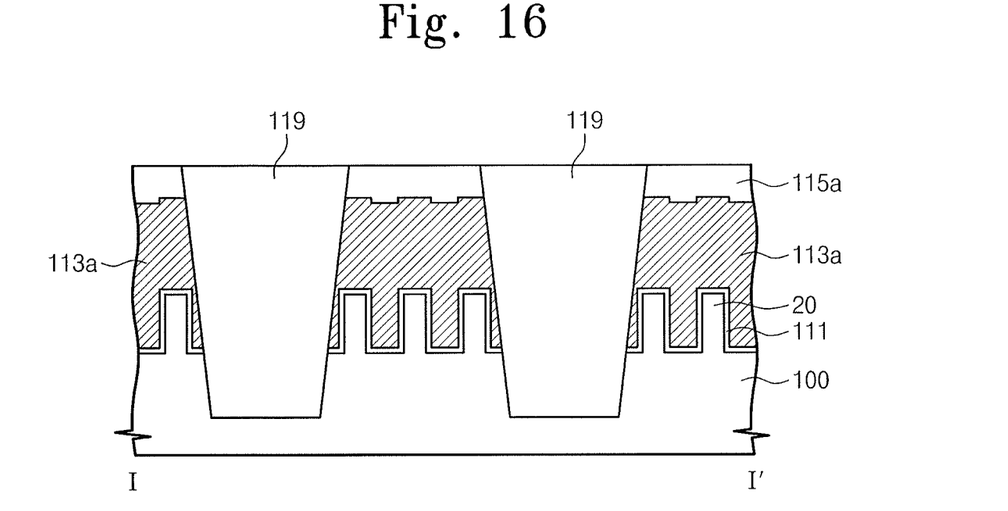

Referring to FIG. 16, the insulating layer 119 may be planarized. In some embodiments, a chemical mechanical polishing (CMP) process may be performed on the insulating layer 119. The etch mask pattern 115a may be used as a planarization stop layer when the insulating layer 119 is polished. The insulating layer 119 may be polished until the top surface of the etch mask pattern 115a is exposed. A polishing rate of the etch mask pattern 115a is less than that of the insulating layer 119. Thus, the polishing of the insulating layer 119 may be stopped when the etch mask pattern 115a is exposed.

Figure 17:
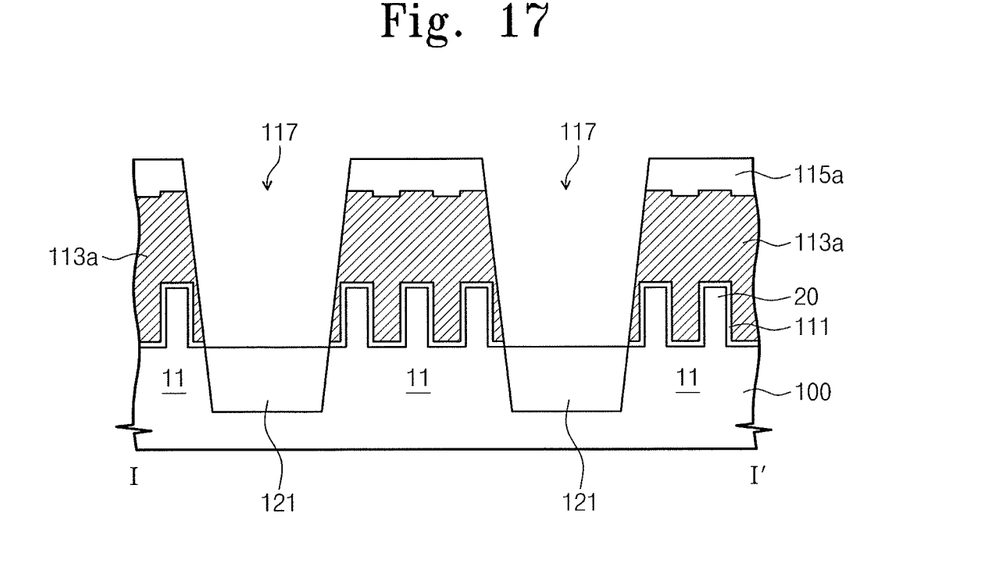

Referring to FIG. 17, a portion of the planarized insulating layer 119 may be removed to form a device isolation layer 121. The planarized insulating layer 119 may be etched using a wet etching process. The device isolation layer 121 may correspond to a remaining portion of the insulating layer 119, after the planarized insulating layer 119 is etched. The device isolation layer 121 may fill the device isolation trench 117 in the semiconductor substrate 100. As a result, the device isolation layer 121 may be formed in the semiconductor substrate 100. In some embodiments, the insulating layer 119 may be etched until a sidewall of the first gate pattern 113a is completely exposed, thereby forming the device isolation layer 121 in the device isolation trench 117. A top surface of the device isolation layer 121 may be disposed at substantially the same level as the top surface of the semiconductor substrate 100 between the fins 20. In other embodiments, the insulating layer 119 may be etched until a portion of the sidewall of the first gate pattern 113a is exposed, thereby forming the device isolation layer 121 in the device isolation trench 117. In this case, a top surface of the device isolation layer 121 may be higher than the top surface of the semiconductor substrate 100 between the fins 20 and may be lower than the top surfaces of the fins 20. The device isolation layer 121 may define at least one active region 11 of the semiconductor substrate 100.

After the device isolation layer 121 is formed, a thin natural oxide layer (not shown) may be formed on a surface of the first gate pattern 113a.

Figure 18:
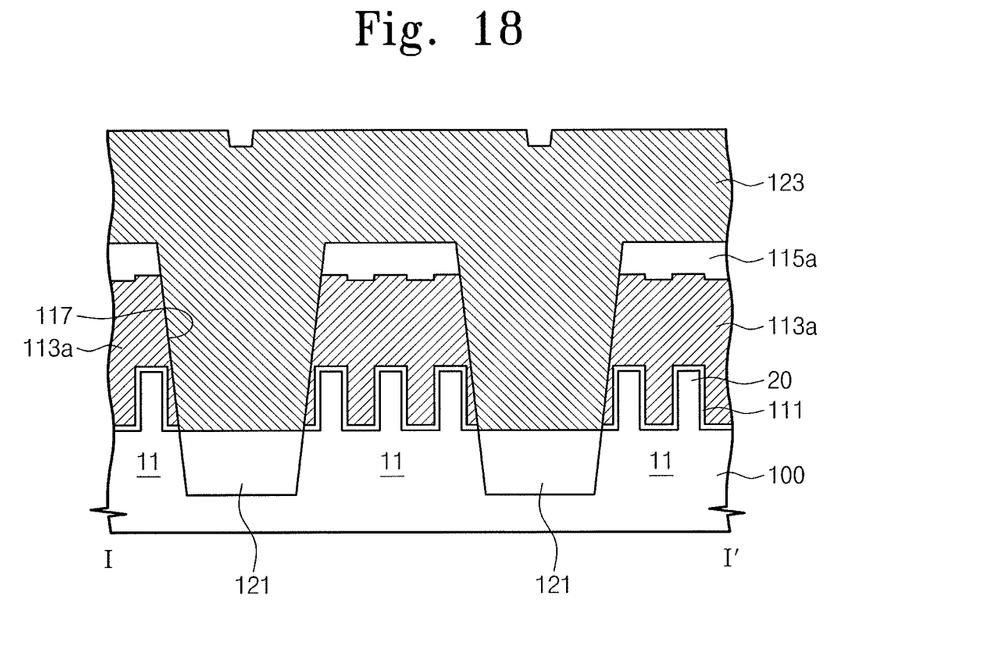

Referring to FIG. 18, a second gate layer 123 may be formed on the semiconductor substrate 100. The second gate layer 123 may cover the top surface of the etch mask pattern 115a. The second gate layer 123 may completely fill the device isolation trench 117. The second gate layer 123 may be formed using a CVD method, a PVD method, and/or an ALD method. The second gate layer 123 may be deposited to have an uneven top surface due to a height difference between the top surface of the device isolation layer 121 and the top surface of the etch mask pattern 115a. The second gate layer 123 may include the same material as the first gate pattern 113a.

Figure 19:
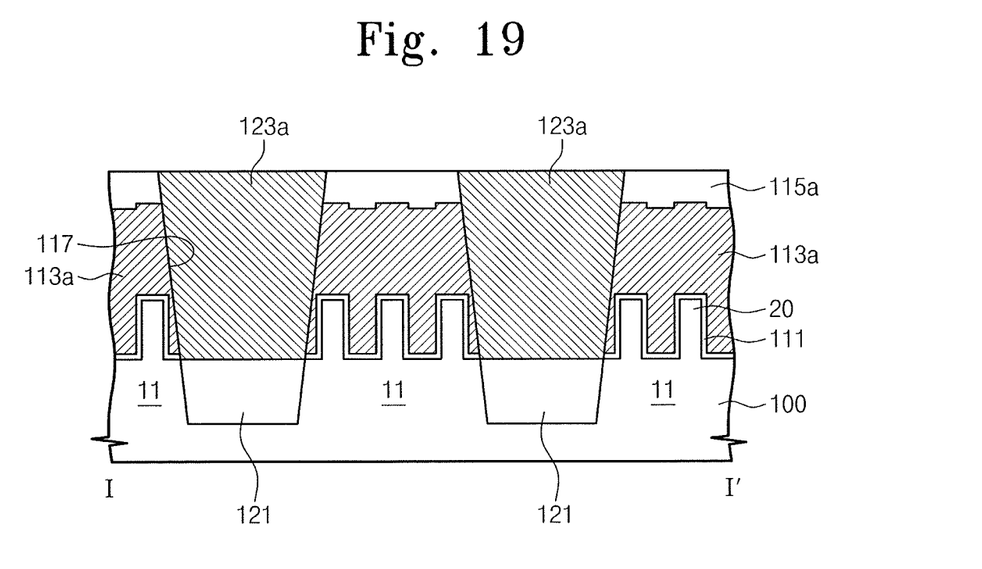

Referring to FIG. 19, the second gate layer 123 may be planarized. In some embodiments, a CMP process may be performed on the second gate layer 123. The second gate layer 123 may be polished until the top surface of the etch mask pattern 115a is exposed. Thus, at least one second gate pattern 123a may be formed to have a flat top surface disposed at substantially the same level as the top surface of the etch mask pattern 115a. Alternatively, the top surface of the second gate pattern 123a may have a concave region due to the uneven top surface of the second gate layer 123.

The etch mask pattern 115a may be used as an etch mask for the formation of the device isolation trench 117 on the first gate layer 113, and may also be used as the planarization stop layer during the planarization process of the insulating layer 119. After the device isolation layer 121 is formed, the etch mask pattern 115a is not removed but may be used as a planarization stop layer during the planarization process of the second gate layer 123. That is, the etch mask pattern 115a may be used as the planarization stop layer during the planarization processes of both the insulating layer 119 and the second gate layer 123. Thus, fabricating processes of the semiconductor device may be simplified. Additionally, a deposition thickness of the etch mask pattern 115a may be controlled regardless of heights of the fins 20. Thus, the etch mask pattern 115a may be easily removed.

Figure 20:
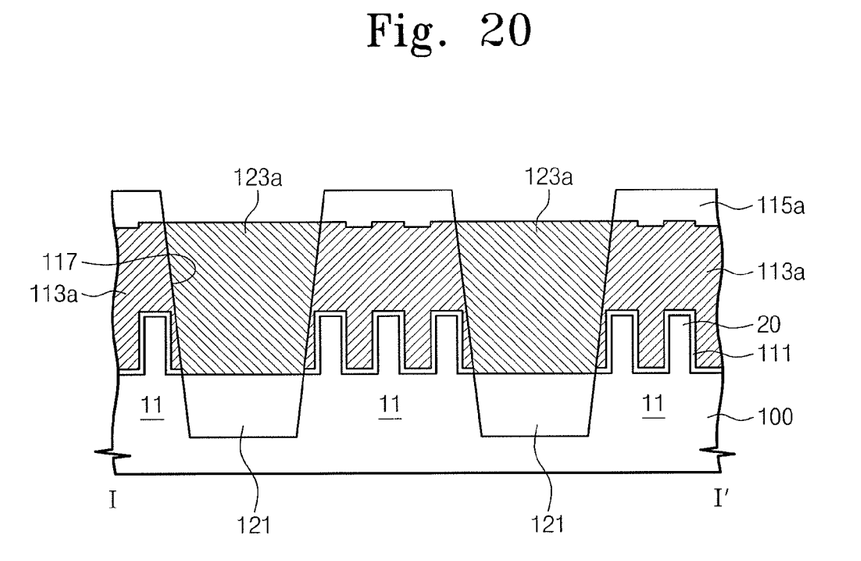

Referring to FIG. 20, the top surface of the second gate pattern 123a exposed by the etch mask pattern 115a may be recessed. Thus, the recessed top surface of the second gate pattern 123a may be lower than the top surface of the etch mask pattern 115a. The recessed top surface of the second gate pattern 123a may be recessed relatively to a top surface of the first gate pattern 113a, so the top surface of the second gate pattern 123a may be preliminary disposed at a substantially same level as the top surface of the first gate pattern 113a. That is, as illustrated in FIG. 20, the top surface of the second gate pattern 123a may be recessed to be disposed at a substantially same level as the top surface of the first gate pattern 113a, e.g., so the second gate pattern 123a and a highest portion of the first gate pattern 113a may have flat top surfaces, i.e., substantially level top surfaces, without a height difference therebetween. The recessing process of the second gate pattern 123a may be performed using a dry etching process or an etch-back process.

Figure 21:
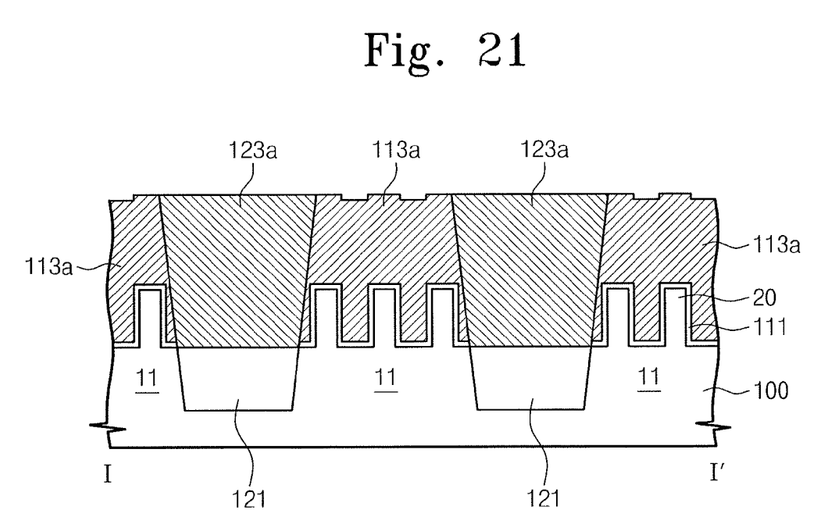

Referring to FIG. 21, the etch mask pattern 115a may be selectively removed. Thus, the top surface of the first gate pattern 113a covered by the etch mask pattern 115a may be exposed. If the etch mask pattern 115a is formed of silicon nitride, the etch mask pattern 115a may be selectively removed using a phosphoric acid ($H_3PO_4$) solution. Alternatively, if the etch mask pattern 115a is formed of silicon oxide, the etch mask pattern 115a may be selectively removed using a hydrofluoric acid (HF) solution.

Figure 22:
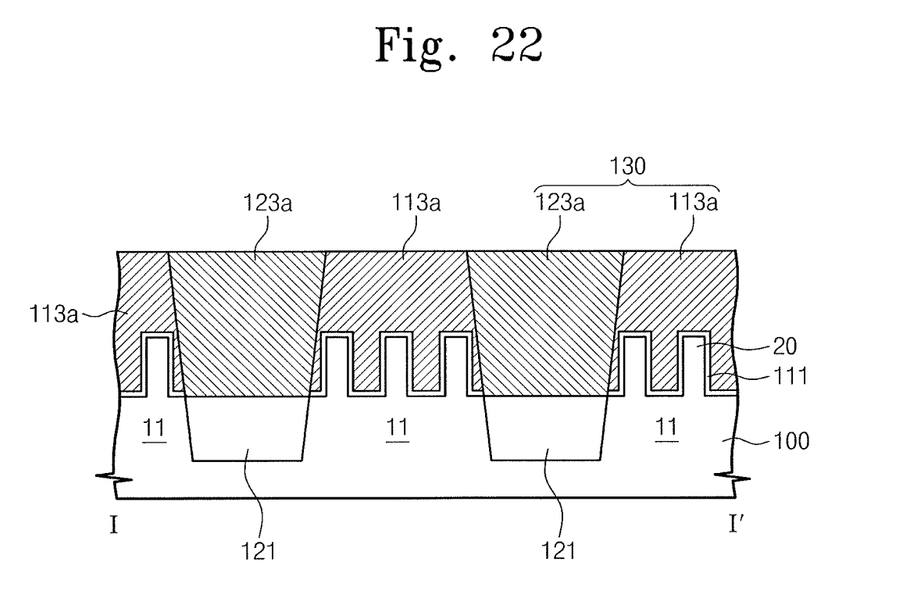

Referring to FIG. 22, the first and second gate patterns 113a and 123a may be planarized. In other words, after the etch mask pattern 115a is removed to expose the top surface of the first gate pattern 113a, the first and second gate patterns 113a and 123a may be planarized at the same time, e.g., simultaneously, to provide a second gate pattern 123a having a top surface that is level with the entire top surface of the first gate pattern 113a. That is, a CMP process may be performed on the first and second gate patterns 113a and 123a. Thus, the first and second gate patterns 113a and 123a may have flat top surfaces, i.e., top surfaces that define a single and evenly flat surface.

Referring again to FIG. 2, the hard mask 135 may be formed on the first and second gate patterns 113a and 123a. The hard mask 135 may cross the fins 20. The hard mask 135 may be formed of an insulating material, e.g., silicon nitride. The first and second gate patterns 113a and 123a exposed by the hard mask 135 may be selectively etched to form the gate electrode 130.

Dopants may be implanted into the semiconductor substrate 100 exposed by the hard mask 135 to form the source region S and the drain region D. The source region S and the drain region D may be formed in the active region 11 adjacent to both sides of the gate electrode 130.

In a method of fabricating a semiconductor device according to embodiments, an etch mask pattern is used in order to form a device isolation trench. The etch mask pattern is not removed after the formation of the trench, so the etch mask pattern may also be used as a planarization stop layer during the planarization processes of the insulating layer and the second gate layer within the trench. Thus, after an initial recessing process of the second gate layer relatively to the first gate layer is performed without removing the etch mask pattern from the top surface of the first gate layer, e.g., to roughly adjust heights of the first and second gate layers, a final simultaneous planarization of the first and second gate layers, i.e., after removal of the etch mask pattern, may be easily controlled and the fabricating processes of the semiconductor device may be simplified.

In contrast, in a conventional fabrication method, planarization of a gate conductive layer may be performed as follows. After all portions of the gate conductive layer are formed, a filling layer may be deposited on the entire gate conductive layer to fill concave regions caused by height differences of the gate conductive layer before further processing, e.g., planarization. However, if heights of the fins are low, while a distance between adjacent fins is small, a dishing of the filling layer may occur during a subsequent planarization. Additionally, the planarization process of the gate conductive layer may be complex and a process time of the planarization process may be long.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming first gate patterns on a semiconductor substrate using an etch mask pattern;
   forming a trench in the semiconductor substrate between the first gate patterns;
   forming an insulating layer in the trench, such that the insulating layer fills the trench and is disposed on the etch mask pattern;
   planarizing the insulating layer until a top surface of the etch mask pattern is exposed;
   etching a portion of the planarized insulating layer to form a device isolation pattern in the trench;
   forming a second gate layer covering the etch mask pattern and disposed on the device isolation pattern; and
   planarizing the second gate layer until the top surface of the etch mask pattern is exposed, such that a second gate pattern is formed.

2. The method as claimed in claim 1, further comprising, before forming the first gate patterns:
   forming fins vertically protruding from the semiconductor substrate; and
   performing a thermal oxidation process on the semiconductor substrate to form a gate insulating layer conformally covering surfaces of the fins.

3. The method as claimed in claim 2, wherein forming the first gate patterns includes removing fins in a region between adjacent first gate patterns to be formed subsequently.

4. The method as claimed in claim 1, wherein forming the device isolation layer includes etching the insulating layer until sidewalls of the first gate patterns are completely exposed.

5. The method as claimed in claim 1, wherein forming the device isolation layer includes etching the insulating layer until portions of sidewalls of the first gate patterns are exposed.

6. The method as claimed in claim 1, wherein the etch mask pattern includes a material having an etch selectivity with respect to the insulating layer and the second gate pattern.

7. The method as claimed in claim 1, wherein the etch mask pattern includes silicon nitride (SiN) or silicon oxide ($SiO_2$).

8. The method as claimed in claim 1, further comprising, after forming the second gate pattern:
   recessing a top surface of the second gate pattern;
   removing the etch mask pattern to expose top surfaces of the first gate patterns; and
   polishing the top surfaces of the first gate patterns and the top surface of the second gate pattern.

9. A method of fabricating a semiconductor device, the method comprising:
   forming first gate patterns on a semiconductor substrate using an etch mask pattern;
   forming a trench in the semiconductor substrate between the first gate patterns;
   forming an insulating layer in the trench, such that the insulating layer fills the trench and cover a top of the etch mask pattern;
   planarizing the insulating layer to expose the top surface of the etch mask pattern;

etching a portion of the planarized insulating layer to form a device isolation pattern in the trench;

forming a second gate layer to fill the trench, such that second gate layer is on the device isolation pattern and on the top of the etch mask pattern;

planarizing the second gate layer to expose the top surface of the etch mask pattern, such that a second gate pattern is formed;

removing a portion of the second gate pattern;

removing etch mask pattern, such that a top surface of the first gate pattern is exposed; and polishing simultaneously the first and second gate patterns to form a uniform flat surface.

10. The method as claimed in claim 9, wherein removing the portion of the second gate pattern includes removing a portion having a thickness that substantially equals a thickness of the etch mask pattern.

11. The method as claimed in claim 9, wherein polishing the first and second gate patterns to form the uniform flat surface includes defining the first and second gate patterns as a single conductive electrode crossing a plurality of fins.

12. The method as claimed in claim 11, wherein, after forming the first gate patterns, the etch mask pattern covers a top surface of only the first gate patterns among the first and second gate patterns.

13. The method as claimed in claim 9, wherein forming the trench includes separating adjacent first gate patterns, such that every trench is between two adjacent first gate patterns.

14. The method as claimed in claim 13, wherein forming the second gate layer in the trench includes filling the trench completely with the second gate layer, such that the second gate layer directly contacts and extends along sidewalls of two adjacent first gate patterns.

15. The method as claimed in claim 14, wherein planarizing the second gate layer and removing a portion of the second gate pattern are performed while the etch mask pattern completely covers a top surface of the first gate pattern.

* * * * *